United States Patent
Stäcker

(10) Patent No.: US 7,268,877 B2
(45) Date of Patent: Sep. 11, 2007

(54) METHOD AND APPARATUS FOR ORIENTING SEMICONDUCTOR WAFERS IN SEMICONDUCTOR FABRICATION

(75) Inventor: Jens Stäcker, Dresden (DE)

(73) Assignee: Infineon Technologies AG, Munich (DE)

( * ) Notice: Subject to any disclaimer, the term of this patent is extended or adjusted under 35 U.S.C. 154(b) by 296 days.

(21) Appl. No.: 10/816,184

(22) Filed: Apr. 2, 2004

(65) Prior Publication Data

US 2004/0257572 A1 Dec. 23, 2004

(30) Foreign Application Priority Data

Apr. 2, 2003 (DE) ............... 103 15 086

(51) Int. Cl.
*G01B 11/00* (2006.01)
(52) U.S. Cl. .................... 356/401; 356/399
(58) Field of Classification Search .......... 250/548; 355/53, 55, 77; 356/399–401; 382/151; 430/5, 22, 30
See application file for complete search history.

(56) References Cited

U.S. PATENT DOCUMENTS

| | | | |
|---|---|---|---|
| 4,408,884 A | 10/1983 | Kleinknecht et al. | |
| 4,419,013 A | 12/1983 | Heimer | |
| 5,726,757 A * | 3/1998 | Kato et al. | 356/399 |
| 6,171,736 B1 * | 1/2001 | Hirayanagi | 430/22 |
| 6,657,736 B1 * | 12/2003 | Finarov et al. | 356/625 |
| 6,717,670 B2 * | 4/2004 | Becker-Ross et al. | 356/328 |
| 6,724,464 B2 * | 4/2004 | Yang et al. | 355/55 |
| 6,856,408 B2 * | 2/2005 | Raymond | 356/601 |
| 2001/0033996 A1 * | 10/2001 | Lin | 430/311 |
| 2002/0158193 A1 | 10/2002 | Sezginer et al. | |
| 2003/0048444 A1 | 3/2003 | Takahashi | |
| 2003/0053058 A1 | 3/2003 | Tanaka | |
| 2004/0247172 A1 * | 12/2004 | Mitsui | 382/141 |
| 2005/0088636 A1 * | 4/2005 | Kurosawa | 355/53 |

FOREIGN PATENT DOCUMENTS

DE 69128667 T2 7/1991

\* cited by examiner

*Primary Examiner*—Layla G. Lauchman
*Assistant Examiner*—J. Underwood
(74) *Attorney, Agent, or Firm*—Patterson & Sheridan, L.L.P.

(57) ABSTRACT

Described are systems and methods for orienting a semiconductor wafer during semiconductor fabrication with the aid of an optical alignment system, the semiconductor wafer having an alignment mark with regular structures, on the basis of which the position of the semiconductor wafer can be determined.

16 Claims, 8 Drawing Sheets

METHOD AND APPARATUS FOR ORIENTING SEMICONDUCTOR WAFERS IN SEMICONDUCTOR FABRICATION

CLAIM FOR PRIORITY

This application claims priority to German Application No. 10315086.2 filed Apr. 2, 2003, which is incorporated herein, in its entirety, by reference.

TECHNICAL FIELD OF THE INVENTION

The invention relates to a method and an apparatus for precisely orienting a semiconductor wafer in semiconductor fabrication. In this case, first of all the position of an alignment mark arranged on the semiconductor wafer is determined with the aid of a first optical measurement method and the alignment mark is subsequently corrected with the aid of a line profile.

BACKGROUND OF THE INVENTION

Modern integrated circuits (ICs) comprise a complex arrangement of components and electronic structures which are interconnected with one another in a plurality of planes arranged one above the other. The fabrication of such circuits constitutes a complicated sequence of different process steps. Inter alia, more than 25 different patterning steps have become necessary in the meantime in the fabrication of specific circuits.

As a reaction to the demand for ever faster and more expedient integrated circuits, the semiconductor industry is always endeavoring to realize ever smaller circuit dimensions. Again and again more complex fabrication processes are developed in the course of this, said processes permitting a higher integration density. However, the increase in the integration density and the reduced feature sizes associated therewith are also accompanied by an increase in the requirements made of the precision of the processes used.

One of the most important processes and one which is carried out the most often in semiconductor fabrication is the photolithographic patterning process, in which a structure arranged on an exposure mask is transferred into a photoresist layer, applied to the wafer surface beforehand, by means of an exposure unit and subsequent selective etching. In this case, what is particularly important is the accurate overlay of the transferred structure with structures that are already present on the wafer surface. Thus, even small overlay errors (center position errors) of structures produced in different steps may prove to be extremely critical with regard to the functionality of a large scale integrated circuit. Therefore, the overlay is accorded one of the key roles in the modern semiconductor process with regard to performance and yield.

However, the overlay also plays an important role with regard to the integration density itself. Generally, in the case of integrated circuits, the so-called relative center position error of two structures arranged one above the other (such as e.g. interconnect and contact hole) is permitted to exceed not more than about one third of the minimum structure if the intention is to fully utilize the packing density that is possible with the minimum structure.

In order to reduce the center position error, it is necessary to orient the semiconductor wafers as accurately as possible within the corresponding devices. This orientation operation is called alignment. The alignment operation in an exposure device of a photolithography installation for the accurate overlay of a mask structure with a structure that is already present on the wafer is composed of three individual steps: first of all, it is necessary to identify suitable alignment marks on the wafer surface. This is generally done with the aid of a light-optical microscope (alignment microscope), an optical parameter of a light reflected from the wafer surface being evaluated by eye or automatically. Afterward, it is necessary to determine the positional error of the alignment marks relative to the alignment microscope or relative to the mask. Finally, in order to correct the relative positional error, it is necessary to execute relative movements between wafer and alignment microscope or mask.

The determination of the alignment mark position takes place with the aid of known optical methods which, depending on the alignment mark, can supply a contrast between different regions of the alignment mark. In particular, the edge contrast, phase contrast, diffraction contrast or Fresnel zone method is taken into consideration in this case. None of these methods is unproblematic, however, because the contrast of the alignment marks which is used for position determination depends on the surface constitution of the measurement object (e.g. layer thicknesses, surface roughness and/or edge profile of the alignment mark). However, the surface constitution of the alignment marks generally depends on the fabrication process respectively used. The dictates of the process mean that the structures of the alignment marks therefore often have profile fluctuations which do not permit any accurate determination of the alignment mark position and thus the accurate alignment of the wafer with the aid of the methods used for this purpose heretofore.

SUMMARY OF THE INVENTION

The object of the invention is to provide a method which permits a more precise orientation of a semiconductor wafer in semiconductor fabrication. Furthermore, it is an object of the invention to provide an apparatus for carrying out the method.

This object is achieved by means of a method in accordance with claim 1 and an apparatus in accordance with claim 9. Further advantageous embodiments are specified in the dependent claims.

The method according to the invention uses an improved optical alignment system for the orientation of a semiconductor wafer, said alignment system providing a combination of two optical measurement methods. In this case, in a first step, a first position information item of an alignment mark arranged on the semiconductor wafer is determined with the aid of an optical measurement method that is optimized for position determination. In a further step, the determination of a line profile of the alignment mark in a predetermined direction takes place with the aid of an optical measurement method that is optimized for profile determination. According to the invention, the line profile of the alignment mark that is obtained in this case is used for correcting the first position information item obtained from the first step. The second position information item of the alignment mark that is determined by the correction is subsequently used for the positioning or the modeling of the semiconductor wafer. What is advantageous about the method according to the invention is that the combination of two optical measurement methods, one measurement method being optimized for the optical position determination and one measurement method being optimized for the optical profile determination of an alignment mark, enables the calculation of a particularly precise position information item. As a result of this, the semiconductor wafer can be oriented relative to a production tool more accurately than heretofore. An improved orientation of the semiconductor wafer relative to the production tool in turn brings about an improved overlay accuracy of the structures of the different layers and thus also larger process windows. Higher packing densities of the structures are possible, in principle, on account of the lower overlay errors, as a result of which the performance of the semiconductor circuit can also be improved. A better overlay accuracy likewise results in a higher yield, and thus also contributes to lowering the fabrication costs.

In one advantageous embodiment of the invention, the first position information items are determined with the aid of an optical alignment microscope, the alignment mark being illuminated with light radiation from a light source and an optical parameter of the light radiation, which is influenced by the alignment mark, being measured in a spatially resolved manner in dependence on the relative position of the alignment mark with respect to the alignment microscope. This is followed by the generation of an intensity profile of the optical parameter for the alignment mark in the predetermined direction, those relative positions of the alignment mark with respect to the alignment microscope being determined in the case of which the optical parameter exceeds or falls below a predetermined threshold value. In the subsequent method step, the first position information item of the alignment mark is calculated with the aid of the intensity profile. This method, which is conventionally used for the alignment of a semiconductor wafer, has the advantage that the first position information item can thereby generally be determined sufficiently rapidly, so that no unnecessary waiting times arise during the process.

It is particularly advantageous in this case to measure the intensity, the phase and/or the polarization of the light radiation from a light source that is influenced by the alignment mark. Measurements with the aid of these measurement methods can be carried out within a relatively short time, so that enough process time remains for the subsequent steps of the method according to the invention.

In a further advantageous embodiment of the invention, the line profile of the alignment mark is determined with the aid of an optical scattered radiation measuring device, the alignment mark being illuminated with light radiation from a light source and a diffraction pattern which arises as a result of the interaction of the light radiation with the regular structures of the alignment mark being detected. Afterward, the line profile of the alignment mark is determined on the basis of the diffraction pattern with the aid of a data processing device. What is advantageous in this case is that this method can be integrated within a conventional alignment system in a simple manner. With the aid of a data processing device and through adjustment with diffraction patterns in a database, the profile determination can be carried out sufficiently rapidly by means of this method, so that, in this case, too, no waiting times have to be accepted. The use of the scattered radiation measuring device furthermore makes it possible to determine the line profile of the regular structures of the alignment mark with a high resolution. This enables a position determination and thus the orientation of the semiconductor wafer with a correspondingly high accuracy.

In a further advantageous embodiment of the invention, an edge contrast, phase contrast, diffraction contrast or Fresnel zone method is used for measuring the intensity profile of the alignment mark. The measurement method used can advantageously be adapted to the respective conditions of an alignment mark.

It is furthermore advantageous that the alignment mark comprises regular structures formed as line or point grids oriented orthogonally with respect to the predetermined direction. These structures are particularly well suited to line profile determination with the aid of one of the scattered radiation measuring methods provided.

The use of at least two marks arranged spatially separated from one another on the semiconductor wafer enables the semiconductor wafer to be oriented two-dimensionally, it also being possible to detect rotations of the semiconductor wafer with respect to a predetermined orientation. Furthermore, it is also possible by this means to identify process-dictated distortions of the semiconductor wafer, which may arise e.g. on account of thermal or mechanical stress. By taking account of such distortions in the modeling of the semiconductor wafer, possible negative overlay effects resulting therefrom can largely be avoided.

BRIEF DESCRIPTION OF THE DRAWINGS

The invention is explained in more detail below with reference to drawings, in which.

DETAILED DESCRIPTION OF THE INVENTION

Figure 1:
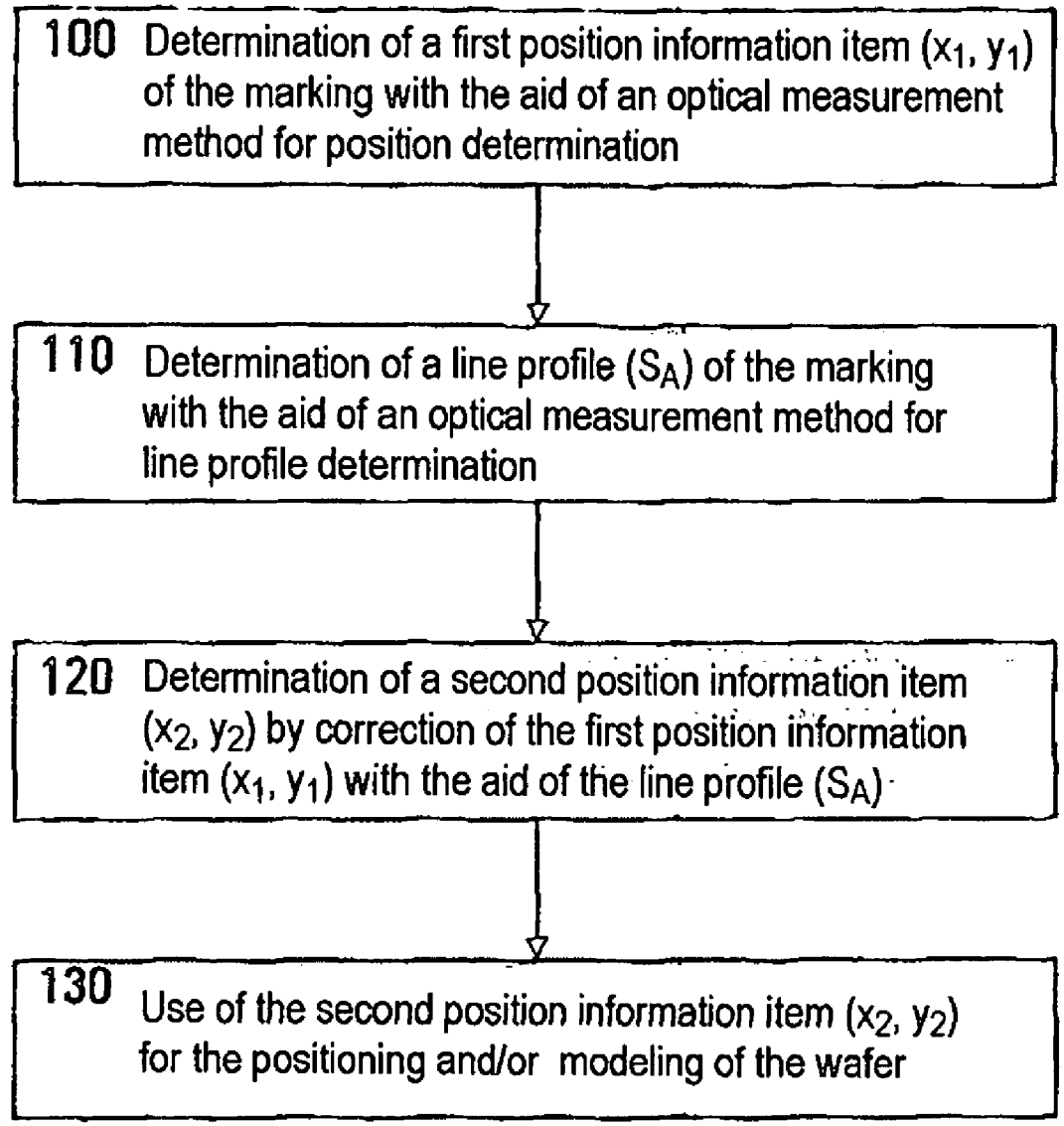
FIG. 1 shows a flow diagram of the method according to the invention.

FIG. 1 shows a flow diagram of a method for orienting a semiconductor wafer in semiconductor fabrication in accordance with claim 1. In this case, the semiconductor wafer W is aligned with the aid of an optical alignment system 10. The wafer W itself is oriented in this case on the basis of an alignment mark M formed on the wafer surface. Said alignment mark M preferably comprises a plurality of depressions (trenches), which have been produced by etching in the wafer surface in preceding process steps.

According to the invention, the alignment of the semiconductor wafer W takes place with the aid of the combination of two optical measurement methods. In the first step 100 of the method according to the invention, a first position information item $x_1$, $y_1$ of the alignment mark M is determined with the aid of a first optical measurement method, which is optimized for position determination. In this case, provision is made of optical scanning methods, in particular, which scan the alignment mark M in a predetermined direction and, in the process, can determine positions of high-contrast regions of the alignment mark M. In a second step 110 of the method according to the invention, a line profile $S_A$ of the alignment mark M in the predetermined direction is determined with the aid of an optical measurement method that is optimized for line profile determination. Method step 120 of FIG. 1 effects the determination of a second position information item $x_2$, $y_2$ of the alignment mark in the predetermined direction, the first position information item $x_1$, $y_1$ of the alignment mark M being corrected with the aid of the line profile of the alignment mark M.

In the last method step 130 of FIG. 1, the second position information item $x_2$, $y_2$ is used for the positioning and/or modeling of the semiconductor wafer W.

Figure 2:
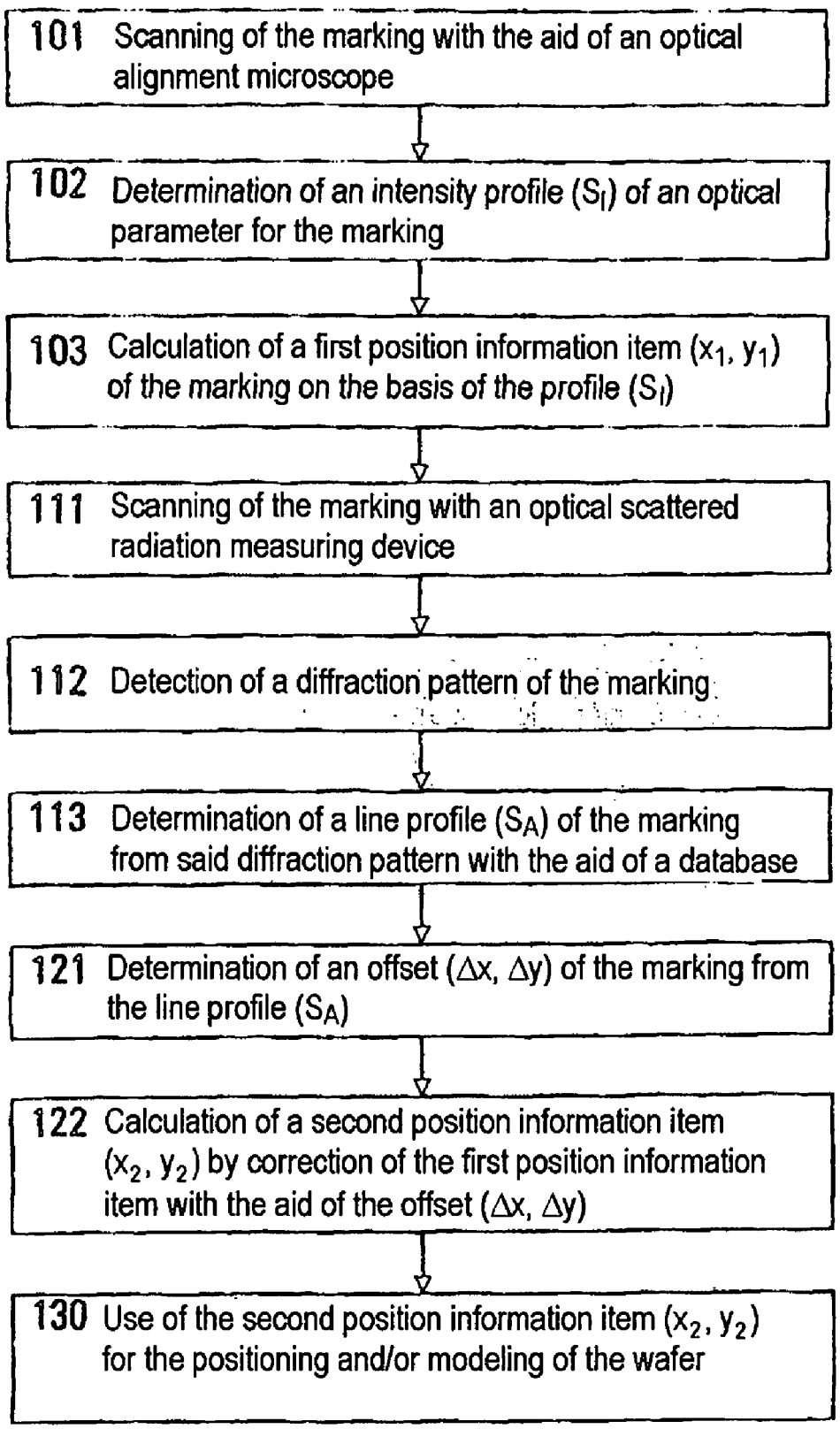
FIG. 2 shows a flow diagram of a preferred embodiment of the method according to the invention, FIG. 3 diagrammatically shows an alignment system according to the invention with an alignment microscope and a scattered radiation measuring device, FIG. 4a diagrammatically shows the alignment system according to the invention in the case of determining an intensity profile of an optical parameter of an alignment mark.

FIG. 2 shows a flow diagram of a preferred embodiment of the method according to the invention. In this case, in method step 101, the alignment mark M is scanned with the aid of an optical alignment microscope 21 in a predetermined direction. In this case, the alignment mark M is illuminated with light radiation 23 from a light source 22 and the interaction of the light radiation 23 with the alignment mark M is examined with the aid of the alignment microscope 21. In particular, an optical parameter, such as e.g. the intensity and quality of the light radiation 23 reflected from the respectively observed region of the alignment mark M, is detected in this case.

In method step 102, an intensity profile $S_I$ of the optical parameter is generated by the measured values for the optical parameter being assigned to relative positions of the alignment mark M with respect to the alignment microscope 21. In particular, positions in the case of which the optical parameter exceeds or falls below a predetermined threshold value are determined in this case. In the subsequent method step 103, the determined intensity profile $S_I$ of the alignment mark M is used to calculate a first position information item $x_1$, $y_1$ of the alignment mark M in the predetermined direction. In this case, specific regions which, depending on the measurement method respectively used, have a high contrast in the intensity profile $S_I$ are preferably used for determining the position of the alignment mark M. By way of example, steeply falling sidewalls of the alignment mark structures $M_1$, $M_2$, $M_3$ are suitable for this purpose. The position information item of the alignment mark M may then correspond directly to the position of one of the high-contrast regions or emerge from a spatial averaging over a plurality of such positions (e.g. as spatial center between the two boundary sidewalls of an alignment mark structure $M_1$, $M_2$, $M_3$).

However, knowledge of the position of such a high-contrast region of the alignment mark structure $M_1$, $M_2$, $M_3$ by itself generally does not suffice for exactly determining the position of the alignment mark M. The dictates of fabrication give rise again and again to variations of the mark structures $M_1$, $M_2$, $M_3$ of different alignment marks, the profiles of the mark structures $M_1$, $M_2$, $M_3$ of an alignment mark M having asymmetrical sidewalls or sidewalls that run nonuniformly. What is typical of such irregularities is that they occur in all the alignment mark structures $M_1$, $M_2$, $M_3$ of an alignment mark M, so that even an averaging over a plurality of alignment mark structures $M_1$, $M_2$, $M_3$ of said alignment mark M does not permit more accurate position determination.

On account of this, a wafer W oriented on the basis of a plurality of individual alignment marks M, M' often has a positional error which, unless negligible, may jeopardize the entire fabrication process.

The exact position of the high-contrast region within the alignment mark M that is used for determining the position of the alignment mark M is subsequently determined with the aid of a line profile $S_A$ of the alignment mark M.

An optical scattered radiation measurement is preferably used for determining the line profile $S_A$ of the alignment mark M. For this purpose, in method step 111, the alignment mark M is scanned by means of the optical scattered radiation measuring device 30, the regular structures $M_1$, $M_2$, $M_3$ of the alignment mark M being illuminated with light radiation 33 from a light source 32. A diffraction pattern which arises on account of interactions of the light radiation 33 with the regular structures $M_1$, $M_2$, $M_3$ of the alignment mark M and is typical of the profile of the respective marking is subsequently detected in method step 112.

The line profile $S_A$ of the alignment mark M in the predetermined direction is then determined with the aid of the measured diffraction pattern. For this purpose, the measured diffraction pattern is evaluated with the aid of a data processing device 40. In this case, the diffraction pattern determined may preferably also be adjusted with diffraction patterns stored in a database 42. For this purpose, the data processing device 40 advantageously has a comparison device 41. The evaluation of the measured diffraction pattern generally permits a sufficiently accurate statement about the actual cross-sectional profile of the alignment mark M, so that the line profile $S_A$ that is reconstructed by this means is suitable for correcting the first position information item $x_1$, $y_1$.

The line profile $S_A$ determined can be used to calculate a second position information item $x_2$, $y_2$ of the alignment mark M, which is more accurate than the first position information item $x_1$, $y_1$. For this purpose, method step 121 effects the determination of the position of the high-contrast region of the alignment mark M, which is also used in the first optical measurement method for determining the position of the alignment mark M, within the line profile $S_A$ with a higher accuracy. An offset $\Delta x$, $\Delta y$ between the position determined in the first optical measurement method and the position of the high-contrast region within the alignment mark M, the latter position being determined with the aid of the second optical measurement method, is preferably calculated in this case. In method step 122, this deviation is used to calculate the second position information item $x_2$, $y_2$; in the simplest case, the offset $\Delta x$, $\Delta y$ may simply be added to the first position information item $x_1$, $y_1$.

The second position information item $x_2$, $y_2$ obtained is largely independent of the individual profile course of the alignment mark M and therefore has a higher accuracy than the first position information item $x_1$, $y_1$. It is used for the positioning and/or modeling of the semiconductor wafer in method step 130.

The apparatus according to the invention is explained in more detail below on the basis of a particularly advantageous embodiment.

Figure 3:
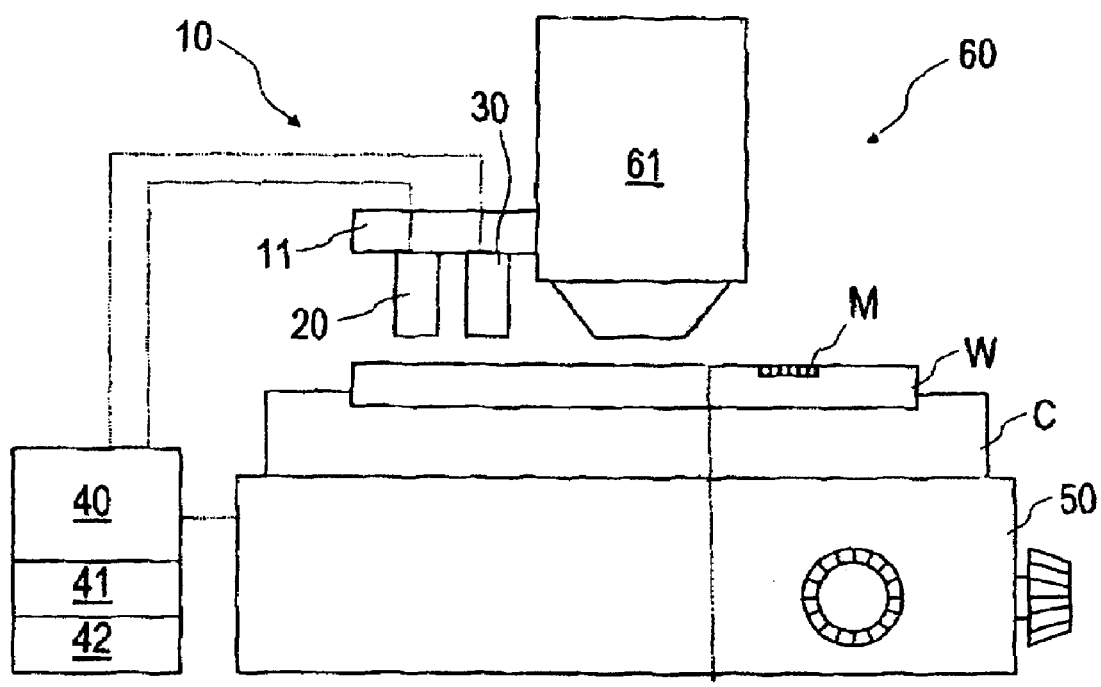

FIG. 3 shows an alignment system 10 according to the invention for aligning the semiconductor wafer W relative to an exposure unit 61 of a lithography installation comprising a first optical measuring device 20—preferably having an optical alignment microscope 21—and a scattered radiation measuring device 30. In this case, the semiconductor wafer W, which is preferably arranged horizontally, is fixed on a chuck C arranged on a positioning device 50 of the exposure installation. The exposure unit 61 is arranged above the wafer W and is used to effect photolithographic exposure of a photoresist (not illustrated here) applied on the semiconductor W. As can be seen from FIG. 3, the two measuring devices 20, 30 that are provided for the orientation of the semiconductor wafer W are fixed to the optical exposure unit 61 by means of a mount 11. The first optical measuring device 20 preferably has an alignment microscope 21, which scans the surface of the semiconductor wafer W at a predetermined distance and, in the process, detects optical properties of the alignment mark M moving through its field of view in dependence on the relative position of the alignment mark M with respect to the alignment microscope 21. In order to determine the optical properties, measurements of an optical parameter, such as e.g. the light intensity, the phase and/or the polarization, of the light radiation 23 from an external light source 22 that is reflected from the alignment mark are taken into consideration in this case. In principle, all methods which supply a sufficient contrast in the case of the alignment mark used are taken into account for the optical measurement method used. These are, in particular, the edge contrast, phase contrast, diffraction contrast and/or Fresnel zone method. The light source 22 used may in this case be an external light source whose light has special properties that are optimized for the respective measurement method. Furthermore, light from the exposure unit 61 may also be used, however.

As is furthermore shown in FIG. 3, a scattered radiation measuring device 30 is arranged between the optical alignment microscope 21 and the exposure unit 61, and likewise scans the surface of the semiconductor wafer W preferably at a small height with respect thereto.

With the aid of the positioning device 50 shown in FIG. 3, it is possible to execute relative movements between the semiconductor wafer. W and the alignment system 10. In this case, use is preferably made of an automatic positioning device 50, which, with the aid of an electric motor and a control unit, moves the wafer W below the exposure unit 61 and the measuring devices 20, 30. As an alternative, however, manual positioning devices with micrometer screws are also conceivable in order to position the semiconductor wafer W relative to the alignment system 10 with a high precision.

As shown in FIG. 3, the semiconductor wafer W has an alignment mark M arranged on its surface, the wafer W being aligned on the basis of said alignment mark. In this case, said alignment mark M is preferably formed as a specific number of trench structures $M_1$, $M_2$, $M_3$ produced in the semiconductor surface. In this case, it is also possible, in principle, to use web structures which separate the trenches from one another. Furthermore, other structures are also conceivable which are applied e.g. on the wafer surface and permit a sufficient contrast during the measurement methods used. Furthermore, the number, the form and the dimensions and also the spacing of the structures $M_1$, $M_2$, $M_3$ can be adapted to the measurement method respectively used.

A data processing device 40 is provided for evaluating the measured values, said data processing device being connected in each case to the first and the second optical measuring device 20, 30. As shown by way of example in FIG. 3, the data processing device 40 also comprises a comparison device 41 in order to adjust the diffraction patterns measured with the aid of the second optical measuring device 30 with diffraction patterns of a database 42. The positioning device 50 may advantageously be controlled with the aid of the data processing device 40. For this purpose, the data processing device 40 is connected to the positioning device 50.

Figure 4A:
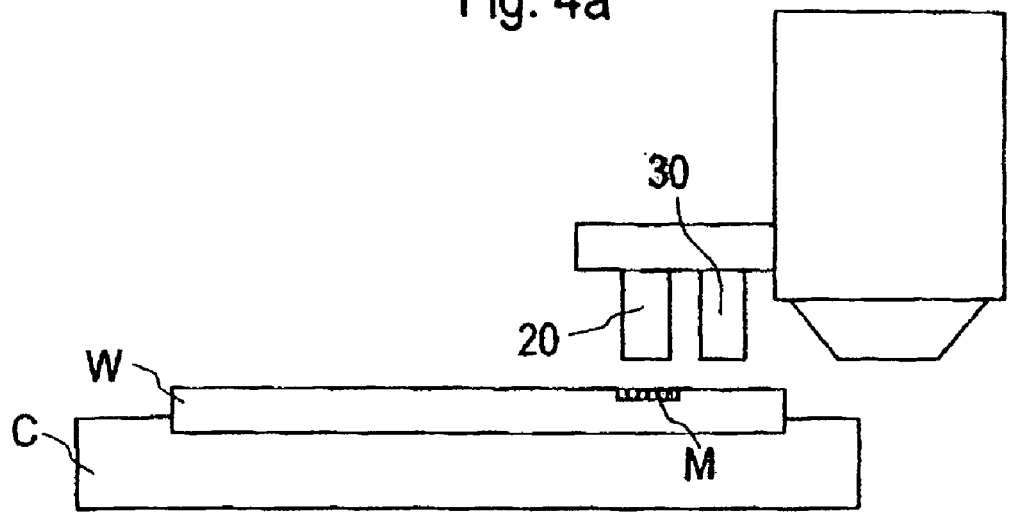
FIG. 4b shows a detail view with respect to FIG. 4a, FIG. 5a diagrammatically shows the optical alignment system in the case of determining a line profile of the alignment mark.

FIG. 4a shows the alignment system 10 from FIG. 3 in the case of determining the position of the semiconductor wafer W. This position determination, corresponding to method step 101, is effected with the aid of the alignment microscope 21. For this purpose, as shown in FIG. 4a, the semiconductor wafer W is preferably positioned below the alignment microscope 21 with the aid of the positioning device 50. In this case, the semiconductor wafer W is generally moved through below the alignment microscope 21, in a coarse alignment mode, until the alignment mark M appears in the field of view of the alignment microscope 21. As soon as the alignment mark M has been identified, the alignment system 20 then changes to a fine alignment mode, in which the semiconductor wafer W can be positioned more slowly and more precisely. In this case, the identification of the alignment mark M preferably takes place automatically, the alignment mark M being identified on the basis of the typical structures $M_1$, $M_2$, $M_3$ and/or the effects brought about by the interaction of the structures $M_1$, $M_2$, $M_3$ with the light from an external light source 22. By way of example, a detection of the intensity fluctuations of the light radiation 23 reflected from the alignment mark M may be used for this purpose.

Figure 4B:
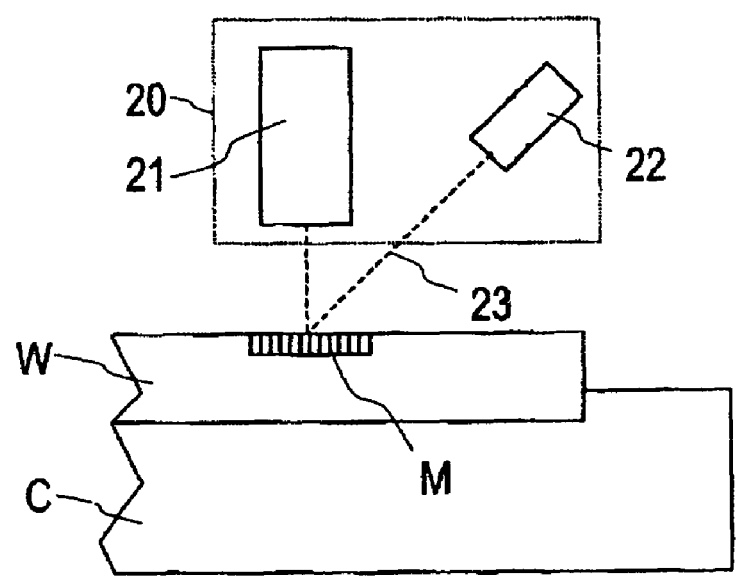

FIG. 4b shows a detail from FIG. 4a, a measurement operation of the first optical measuring apparatus being illustrated. In this case, the light from an external light source 22 is reflected from the alignment mark M on the wafer surface and subsequently evaluated with the aid of an alignment microscope 21 and evaluation electronics (not shown here) connected thereto. In this case, a CCD sensor which converts the intensity of the incident light into an electrical signal is preferably used as the evaluation electronics.

The configuration of light source 22 and alignment microscope 21 as shown in FIG. 4b represents a preferred embodiment of the invention. However, other configurations are also conceivable, in which case, depending on the measurement method used, light from a plurality of light sources, having a different wavelength or a different polarization may also be used for illuminating the alignment mark M.

Figure 5A:
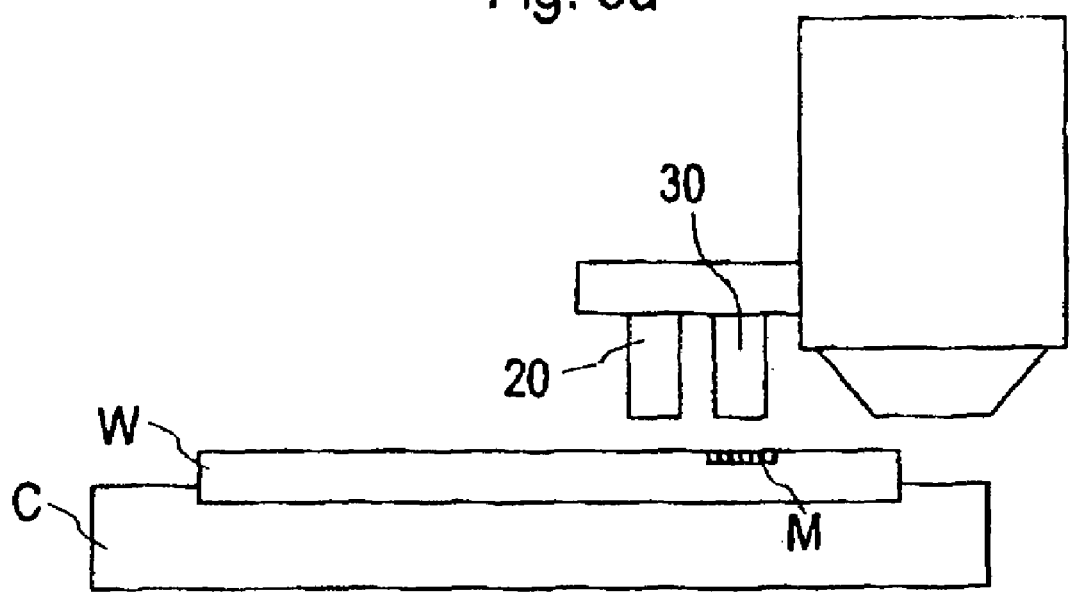
FIG. 5b shows a detail view with respect to FIG. 5a, FIG. 6 shows a diagrammatic illustration of the line profile and the intensity profile of the alignment mark.

FIG. 5a shows the alignment system 10 in the case of the invention's determination of the line profile $S_A$ of the alignment mark M with the aid of a scattered radiation measuring device 30. For this purpose, the semiconductor wafer W has been positioned with the aid of the positioning device 50 such that the alignment mark M arranged on the wafer surface is situated below the scattered radiation measuring device 30. If a position determination with the aid of the alignment microscope 21 has taken place beforehand, so that the first position information item $x_1$, $y_1$ of the alignment mark M is already known, the semiconductor wafer W is preferably displaced automatically by a defined distance corresponding to the distance between the two measuring devices. In the case where the determination of the line profile $S_A$ of the alignment mark M with the aid of the scattered radiation measuring device 30 is effected before the determination of the intensity profile $S_I$, the alignment mark M can also be accurately positioned below the scattered radiation measuring device 50 with the aid of the measured diffraction pattern. For this purpose, the wafer W is positioned below the scattered radiation measuring device 30 with the aid of the positioning device 50 until a diffraction image of the alignment mark M that is typical of the measuring device is measured. A fine alignment can then be effected e.g. on the basis of the light intensity averaged over the entire diffraction pattern.

Figure 5B:
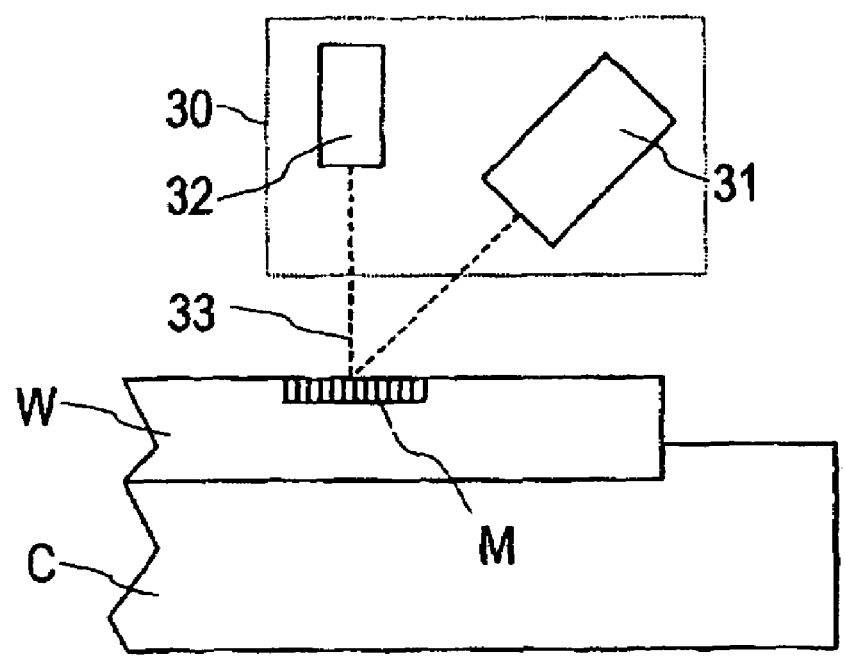

FIG. 5b shows a detail view with respect to FIG. 5a, the measurement principle of the optical scattered radiation measuring device 30 being illustrated. As can be seen from this figure, the scattered radiation measuring device 30 preferably has a dedicated light source 32, the light from which is incident on the alignment mark M. In this case, the light source 32 used for measuring the scattered radiation preferably generates a highly focused light beam 33, the diameter of which is adapted to the respective alignment mark, only the alignment mark structures $M_1$, $M_2$, $M_3$ that are suitable for the scattered radiation measurement preferably being detected. Depending on the measurement method used, coherent light having one or more wavelengths is used in this case (e.g. laser).

The light incident on the alignment mark M is reflected from the surface of the wafer W. On account of the regular structures $M_1$, $M_2$, $M_3$ of the alignment mark M, the light is scattered in this case, thereby producing a diffraction pattern that is typical of the respective alignment mark M. Said diffraction pattern is detected with the aid of the detector 31 shown in FIG. 5b. In principle, different configurations of light source 32 and detector 31 may be realized for measuring the diffraction pattern. Depending on the measurement method respectively used, the light source 32 and/or the detector 31 may be designed to be moveable around a specific point and in this case to measure first-and/or higher-order diffraction reflections. The structure of the diffraction pattern is generally detected with the aid of a stationary light source 32 and a moveable detector 31, it being possible for the semiconductor wafer W additionally to be moved with the aid of the positioning device 50.

Figure 6:
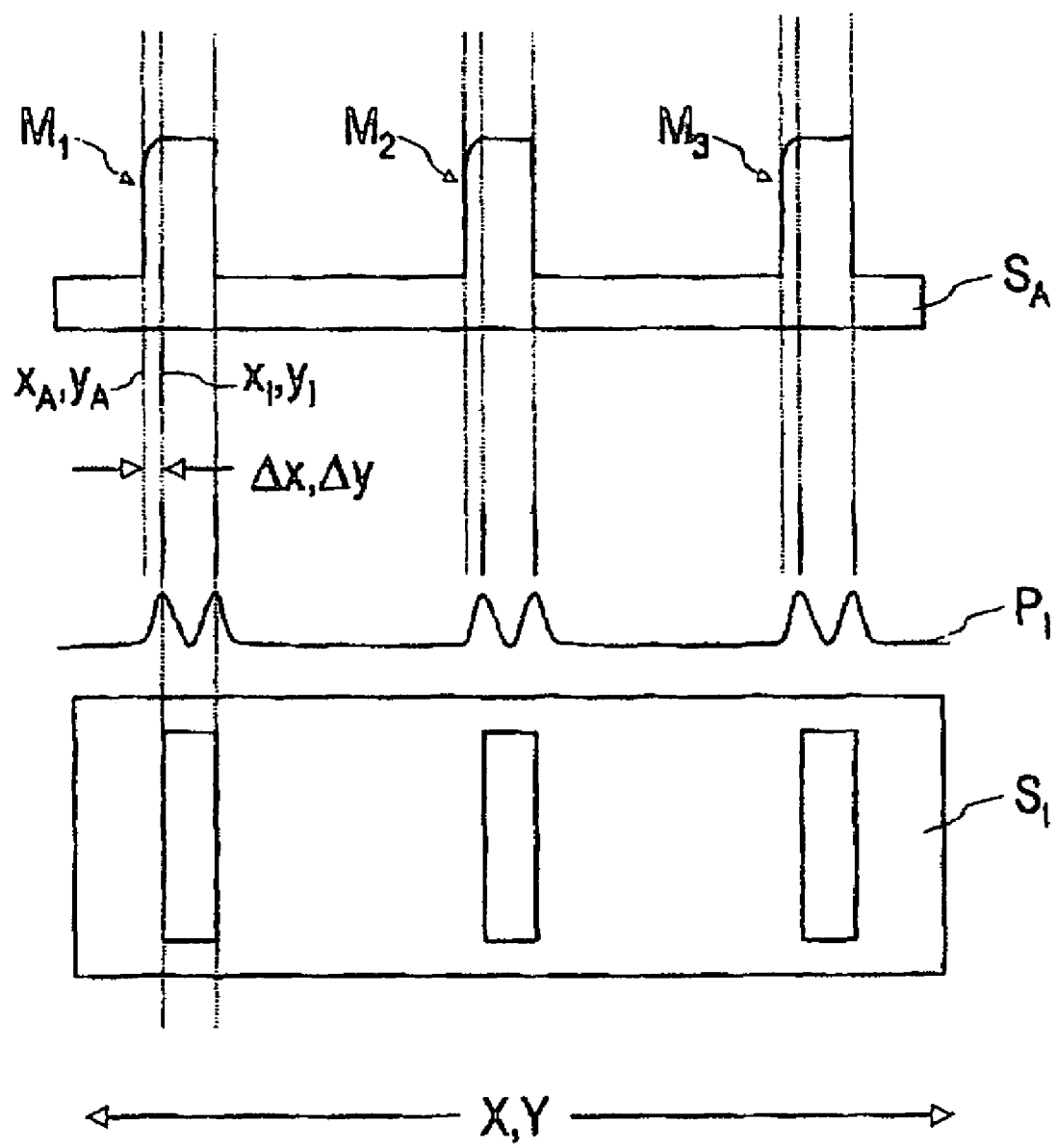

FIG. 6 illustrates the method according to the invention on the basis of an intensity profile $S_I$ and a line profile $S_A$ of the alignment mark M. In this case, the upper part of FIG. 6 shows the line profile $S_A$ of the alignment mark M, which is determined with the aid of a scattered radiation measurement method according to the invention. In this case, this line profile $S_A$ corresponds to a good approximation to the real cross-sectional profile of the alignment mark M in the predetermined direction.

For the purposes of clarity, only three regular alignment mark structures $M_1$, $M_2$, $M_3$ are illustrated. In the present case, said structures $M_1$, $M_2$, $M_3$ are formed as webs between trenches produced with the aid of known patterning processes, said webs being arranged at regular distances from one another. The webs $M_1$, $M_2$, $M_3$ have profiles that are formed nonuniformly and may corrupt a position determination carried out with the aid of an alignment microscope. Since such asymmetries generally arise due to the dictates of the process, they are formed equally in all the structures $M_1$, $M_2$, $M_3$ of the respective alignment mark M. Such an asymmetry is illustrated in FIG. 6 by way of example as a rounding of one of the two edges of the webs $M_1$, $M_2$, $M_3$ that are orthogonal with respect to the scanning direction.

An intensity profile $S_I$ of the same alignment mark M is illustrated by way of example in the lower part of FIG. 6. The intensity profile $S_I$ emerges from the measurement results of the first optical measurement method. In this case, an optical parameter, such as e.g. the light intensity of the light radiation 23 from an external light source 22 that is reflected from a small region of the wafer surface, was preferably detected with the aid of an alignment microscope 21 and a CCD sensor connected thereto over the entire or over a partial region of the alignment mark M. As illustrated by the interrupted lines, only those regions which delimit the horizontal region of the webs $M_1$, $M_2$, $M_3$ were used for the position determination in this case. On account of the rounding at one of the two edges of a web $M_1$, $M_2$, $M_3$, the evaluation of the corresponding measurement produces an incorrect position for the corresponding edge. As emerges from the comparison of the intensity profile $S_I$ with the line profile $S_A$ of the alignment mark M, the position $x_I$, $y_I$ of the corresponding edge that is determined with the aid of the first optical measurement method has an offset $\Delta x$, $\Delta y$ with respect to the edge position $x_A$, $y_A$ determined with the aid of the second optical measurement method. Since the edge positions are used for determining the position of the corresponding alignment mark M, the mark position determined with the aid of the first optical measurement method likewise deviates from the actual mark position. The orientation of the semiconductor wafer W with the aid of the first optical measurement method thus leads to a positional error of the semiconductor wafer W in the corresponding production tool. Furthermore, on account of the individual character of the asymmetries of the alignment mark M that occur, the measurements of the semiconductor wafer W with the aid of a plurality of alignment marks M, M' may lead to incorrect determination of wafer dimensions and thus to the erroneous modeling of the semiconductor wafer W.

As illustrated in FIG. 6, in the conventional orientation process, the edges of the alignment mark structures $M_1$, $M_2$, $M_3$ are detected with the aid of a first optical measurement method by checking an optical parameter in respect of falling below or exceeding a specific threshold value. Such an edge detection method then supplies the positions of the edges e.g. in the form of peaks in the intensity profile $S_I$. In this case, the peaks indicate those positions at which a predetermined threshold value of the measured optical parameter has been exceeded or undershot. In the present exemplary embodiment, these are those lateral regions which delimit the horizontal region of the webs $M_1$, $M_2$, $M_3$ in the line profile $S_A$ of the alignment mark M.

In the present example, the positional error of the corresponding alignment mark M is calculated on the basis of the offset $\Delta x$, $\Delta y$ of the respective structure edges. For this purpose, the edge positions $x_I$, $y_I$ known from the intensity profile $S_I$ can be corrected with the aid of the line profile $S_A$ of the alignment mark M. On the basis of the course of the line profile $S_A$, it is possible to make statements about the edge positions $x_I$, $y_I$ detected by the method of the first optical measurement method. In this case, both edges of a web structure $M_1$, $M_2$, $M_3$ may generally have a corresponding offset $\Delta x$, $\Delta y$. Knowledge about the offset $\Delta x$, $\Delta y$ and about the corresponding edge positions $x_I$, $y_I$ is then used for correcting the first position information item $x_1$, $y_1$ of the alignment mark M, the second position information item $x_2$, $y_2$ then being calculated with the aid of the corrected edge positions $x_A$, $y_A$.

Knowledge of the position of the alignment mark M permits an exact and reproducible positioning of the semiconductor wafer W within the corresponding production tool. Furthermore, on the basis of exact position information items of a plurality of alignment marks M, M', it is possible, in particular, to identify horizontal distortions of the semiconductor wafer W. Such distortions may arise e.g. as a result of thermal or mechanical loading of the semiconductor wafer W during processing and are attributable inter alia to dislocations and fractures within the crystal structure of the monocrystalline semiconductor wafer W.

Figure 7:
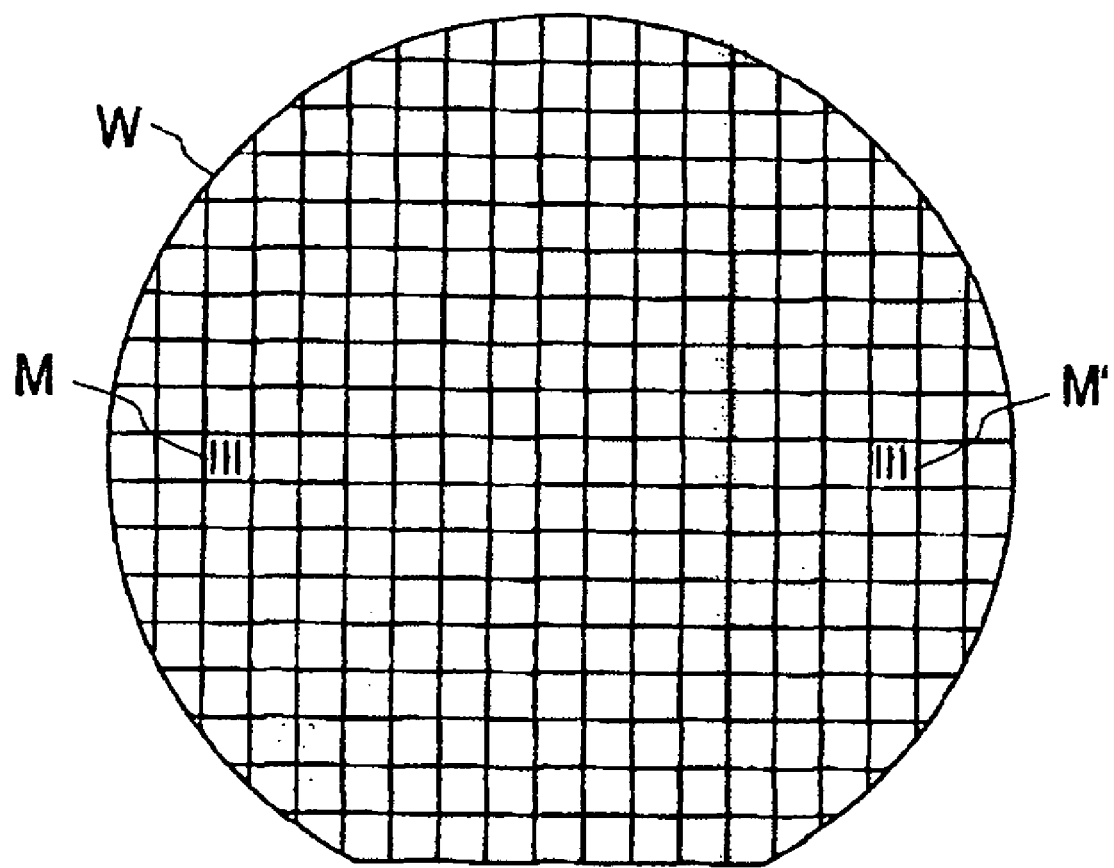
FIG. 7 shows a semiconductor wafer with two alignment marks.

FIG. 7 shows a semiconductor wafer W with two alignment marks M, M', with the aid of which the semiconductor wafer W can be oriented within a lithography tool. The two alignment marks M, M' are preferably arranged spatially remotely from one another, so that it is possible to identify distortions of the semiconductor wafer W which are manifested as a change in the geometrical arrangement of the two alignment marks M, M' with respect to one another. The two alignment marks M, M' preferably have the same structures $M_1$, $M_2$, $M_3$. However, the structures $M_1$, $M_2$, $M_3$ of the two alignment marks M, M' may also differ from one another, depending on the application. Furthermore, it is also possible to arrange further alignment marks for the orientation of the semiconductor wafer W on the wafer surface.

The coarse orientation of the semiconductor wafer W within the carrier C generally takes place on the basis of a flat, arranged in the lower part of the wafer W in FIG. 7.

Figure 8A:
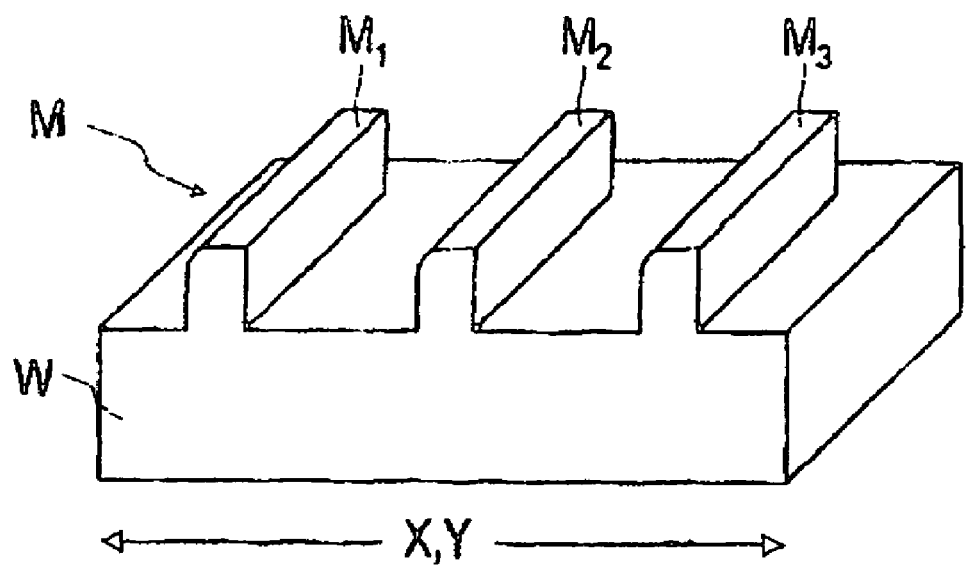
FIG. 8a shows, by way of example, three structures of one alignment mark variant.
Figure 8B:
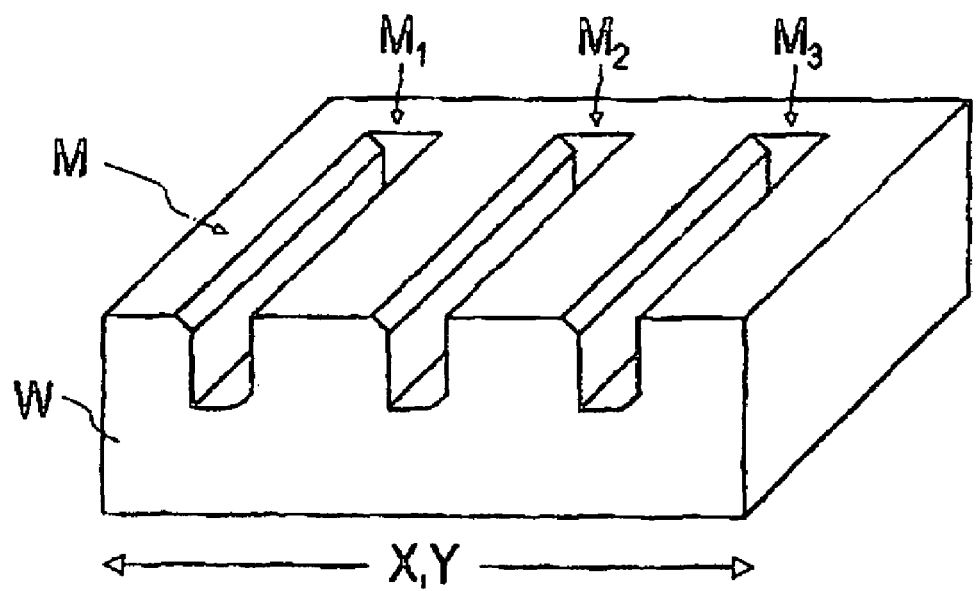
FIG. 8b shows, by way of example, three structures of a further alignment mark variant.

FIGS. 8a and 8b show by way of example two variants of alignment mark structures $M_1$, $M_2$, $M_3$ which may be used for the orientation of the semiconductor wafer W. In this case, FIG. 8a shows three webs $M_1$, $M_2$, $M_3$ formed on the semiconductor surface, which webs have been produced e.g. by the patterning of the semiconductor wafer W with the aid of a photolithographic process. In this case, the semiconductor material between the webs $M_1$, $M_2$, $M_3$ has been removed with the aid of an anisotropic etching process. The webs $M_1$, $M_2$, $M_1$ have idealized steep sidewalls, the left-hand upper edge of the webs $M_1$, $M_2$, $M_3$ in each case: having a rounding due to the dictates of fabrication. As discussed previously, during the measurement of the edge positions in the context of determining the position of the alignment mark M, depending on the measurement methods used, the rounding may lead to incorrect interpretations of the measurement results. The wafer W oriented on the basis of an erroneous edge position and the first position information item $x_1$, $y_1$ of the alignment mark M that is calculated therefrom has a positional error in such a case.

As shown in FIG. 8b, the structures of the alignment mark M may likewise be formed as trench structures produced within the semiconductor surface. Depending on the measurement method used for determining the position of the alignment mark M, in this case, both in the upper and in the lower region of the trenches, localized asymmetries may be responsible for an erroneous edge position. However, knowledge of the actual line profile $S_A$ of the alignment mark M permits a better determination of the edge positions and thus a more accurate calculation of the position of the alignment mark M.

The features of the invention that are disclosed in the preceding description, the claims and the drawings may be essential both individually and in any desired combination for the realization of the invention in its various embodiments.

What is claimed is:

1. A method of orienting a semiconductor wafer during semiconductor fabrication with the aid of an optical alignment system, the semiconductor wafer having an alignment mark with regular structures, on the basis of which the position of the semiconductor wafer can be determined comprising:
    a) determining a first position information item of the alignment mark in a predetermined direction with the aid of an optical measurement method that is optimized for position determination;
    b) determining a line profile of the alignment mark in the predetermined direction with the aid of an optical measurement method that is optimized for profile determination;
    c) determining a second position information item of the alignment mark in the predetermined direction, the first position information item determined in a) being corrected with the aid of the line profile of the alignment mark determined in b); and
    d) positioning the semiconductor wafer by utilizing the second position information item of the alignment mark.

2. The method as claimed in claim 1, a) further comprising:
    aa) scanning the alignment mark in the predetermined direction with the aid of an alignment microscope, the alignment mark being illuminated with light radiation from a light source, and an optical parameter of the light radiation, which is influenced by the alignment mark, being measured in a spatially resolved manner in dependence on the relative position of the alignment mark with respect to the alignment microscope;
    ab) generating an intensity profile of the optical parameter for the alignment mark in the predetermined direction, relative positions of the alignment mark with respect to the alignment microscope being determined in the case of which the optical parameter exceeds or falls below a predetermined threshold value; and
    ac) calculating the first position information item of the alignment mark in the predetermined direction with the aid of the intensity profile determined in method step ab).

3. The method as claimed in claim 2, wherein the intensity, the phase or the polarization of the light radiation is influenced by the alignment mark being measured as the optical parameter in aa).

4. The method as claimed in claim 1, wherein b) comprises:
    ba) scanning the alignment mark in the predetermined direction with the aid of an optical scattered radiation measuring device, the alignment mark being illuminated with light radiation from a light source and a diffraction pattern which arises as a result of the interaction of the light radiation with the regular structures of the alignment mark being detected; and
    bb) determining the line profile of the alignment mark in the predetermined direction from the diffraction pattern detected in substep ba), the diffraction pattern being evaluated with the aid of a data processing device.

5. The method as claimed in claim 2, wherein in c), the second position information item of the alignment mark being calculated with the aid of the two profiles is determined by a procedure which effects the determination of an offset between the position of a first region, which, in the measured intensity profile determines the position of the alignment mark and is dependent on the course of the line profile and the position of a second region, which is selected according to a predetermined criterion from the line profile and is largely independent of the course of the line profile, and the addition of the offset to the first position information item of the alignment mark.

6. The method as claimed in claim 1, wherein the first optical measurement method utilizes an edge contrast, a phase contrast, a diffraction contrast or a Fresnel zone method.

7. The method as claimed in claim 1, wherein the regular structures comprising line grids are oriented orthogonally with respect to the predetermined direction.

8. The method as claimed in claim 1, wherein the orientation of the semiconductor wafer takes place with the aid of at least two alignment marks arranged on the wafer surface.

9. An apparatus having an optical alignment system for determining the position of an alignment mark, which is arranged on the surface of the semiconductor wafer and has regular structures the optical alignment system comprising:
- a first optical measuring device for determining a first position information item of the alignment mark in a predetermined direction with the aid of an optical measurement method that is optimized for position determination,
- a second optical measuring device for determining a line profile for the alignment mark in the predetermined direction with the aid of an optical measurement method that is optimized for line profile determination,
- a data processing device configured to determine a second position information item of the alignment mark by correcting the first position information item utilizing the line profile of the alignment mark, and
- a positioning device configured for setting the relative position of the semiconductor wafer with respect to the second position information item.

10. The apparatus as claimed in claim 9, wherein the first optical measuring device comprises an alignment microscope, said alignment microscope configured to scan the alignment mark and measure an optical parameter of a light radiation influenced by the alignment mark.

11. The apparatus as claimed in claim 9, wherein the second optical measuring device comprising an optical scattered radiation measuring device for detecting diffraction patterns which are caused by the interaction of light radiation from a light source with the regular structures of the alignment mark.

12. The apparatus as claimed in claim 9, wherein the data processing device is designed to determine the line profile of the alignment mark from the diffraction patterns.

13. The apparatus as claimed in claim 12, wherein the data processing device has a comparison device configured to adjust the diffraction patterns determined with diffraction patterns of a database.

14. The apparatus as claimed in claim 9, wherein the optical alignment system being arranged within a lithography installation.

15. The method as claimed in claim 1, wherein b) comprises:
- ba) scanning the alignment mark in the predetermined direction with the aid of an optical scattered radiation measuring device, the alignment mark being illuminated with light radiation from a light source and a diffraction pattern which arises as a result of the interaction of the light radiation with the regular structures of the alignment mark being detected; and
- bb) determining the line profile of the alignment mark in the predetermined direction from the diffraction pattern detected in ba), the diffraction pattern adjusted with diffraction patterns from a database.

16. The method as claimed in claim 1, wherein the regular structures comprise point grids oriented orthogonally with respect to the predetermined direction.

* * * * *